(12) United States Patent
Walker (10) Patent No.: US 8,618,840 B1
(45) Date of Patent: Dec. 31, 2013

(54) FREQUENCY SYNTHESIZER TUNING

(75) Inventor: William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/546,702

(22) Filed: Jul. 11, 2012

(51) Int. Cl.
H03B 21/00 (2006.01)

(52) U.S. Cl.
USPC .................................... 327/105; 331/177 R (58) Field of Classification Search
USPC ................ 327/105–107, 147, 150, 156, 159; 331/177 R
See application file for complete search history.

(56) References Cited

U.S. PATENT DOCUMENTS

| | | | | |
|---|---|---|---|---|
| 6,137,372 A * | 10/2000 | Welland | .................... | 331/117 R |
| 6,259,327 B1 * | 7/2001 | Balistreri et al. | ............... | 331/11 |
| 6,563,387 B2 * | 5/2003 | Hirano et al. | .................... | 331/11 |
| 6,597,249 B2 | 7/2003 | Chien et al. | | |
| 6,710,664 B2 * | 3/2004 | Humphreys et al. | ............ | 331/11 |
| 6,903,613 B1 * | 6/2005 | Mitchell et al. | ................. | 331/11 |
| 7,047,146 B2 * | 5/2006 | Chuang et al. | ................ | 702/106 |
| 7,164,322 B1 * | 1/2007 | Knotts et al. | ................... | 331/1 A |
| 7,486,147 B2 * | 2/2009 | Khorram | ........................ | 331/16 |
| 7,511,579 B2 * | 3/2009 | Wang et al. | ..................... | 331/16 |
| 7,808,288 B2 * | 10/2010 | Chatterjee | ...................... | 327/156 |
| 8,436,686 B2 * | 5/2013 | Kuo et al. | ........................ | 331/16 |
| 2002/0036545 A1 * | 3/2002 | Fridi et al. | ....................... | 331/17 |
| 2005/0226357 A1 * | 10/2005 | Yoshimura | ..................... | 375/376 |

* cited by examiner

Primary Examiner — William Hernandez
(74) Attorney, Agent, or Firm — Maschoff Brennan (57) ABSTRACT

A frequency synthesizer circuit includes a phase determinator configured to output a phase difference signal based on a phase difference between an output signal and a reference signal. The frequency synthesizer circuit may further include a voltage controlled oscillator configured, during a fine tuning mode, to generate the output signal based on the phase difference signal and a value of a frequency band signal. The voltage controlled oscillator may be further configured, during a coarse tuning mode, to generate the output signal based on a voltage and the value of the frequency band signal. The frequency synthesizer circuit may further include a control unit configured to generate the frequency band signal. The value of the frequency band signal may be static during the fine tuning mode and changing during the coarse tuning mode based on a frequency difference between the reference signal and the output signal.

15 Claims, 6 Drawing Sheets

FREQUENCY SYNTHESIZER TUNING

FIELD

The embodiments discussed herein are related to frequency synthesizers.

BACKGROUND

A frequency synthesizer is a device that synthesizes signals to generate and output a desired signal that is related to a reference signal. A frequency synthesizer may be used in radio communications to generate a carrier signal, in a transmitter/receiver in a wireline or optical communications system, in a microprocessor, or in testing equipment for electric circuits, among other circuits.

In general, a frequency synthesizer includes a phase locked loop to set and maintain the output signal of the frequency synthesizer. A phase locked loop may include components such as a phase detector, one or more charge pumps, one or more loop filters, a feedback clock divider, and a voltage controlled oscillator. These components each bring design challenges to be overcome so that a phase locked loop may minimize undesirable characteristics such as susceptibility to phase noise and reference spurs while maximizing desirable characteristics such as frequency range and bandwidth.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a frequency synthesizer circuit may include a phase determinator configured to output a phase difference signal based on a phase difference between an output signal and a reference signal. The frequency synthesizer circuit may further include a voltage controlled oscillator configured, during a fine tuning mode, to generate the output signal based on the phase difference signal and a value of a frequency band signal. The voltage controlled oscillator may be further configured, during a coarse tuning mode, to generate the output signal based on a voltage and the value of the frequency band signal. The frequency synthesizer may further include a disconnect unit configured, during the coarse tuning mode, to electrically disconnect an input of the voltage controlled oscillator from an output of the phase determinator. The disconnect unit may be further configured to supply the voltage to the voltage controlled oscillator during the coarse tuning mode. The frequency synthesizer may further include a control unit configured to generate the frequency band signal. The value of the frequency band signal may be static during the fine tuning mode and changing during the coarse tuning mode based on a frequency difference between the reference signal and the output signal.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments described herein may include a frequency synthesizer circuit for locking an output signal generated by a voltage controlled oscillator (VCO) to a reference signal. The frequency synthesizer circuit may include a coarse tuning mode and a fine tuning mode to allow the VCO to have reduced phase noise due to a low gain while still producing an output signal over a broad range of frequencies. During the coarse tuning mode, the VCO may be tuned to a desired one of multiple frequency bands that contains a range of frequencies that includes a reference frequency of the reference signal. After being tuned to the correct frequency band, the VCO may be tuned during the fine tuning mode so that the output signal locks to, i.e., matches and/or approximates, the reference signal.

Tuning the VCO to the desired frequency band during the coarse tuning mode may be performed by a control unit. The control unit may perform a bi-section selection method to tune the VCO. During the bi-section selection method, the control unit may select between different frequency bands to determine the desired frequency band by comparing the output signal to the reference signal. To compare the output signal to the reference signal, the control unit may use counters to count edges of the output signal and the reference signal. The control unit may then compare overflow signals from the counters to determine a frequency of the output signal relative to a frequency of the reference signal. Based on the comparison of the overflows signals, the control unit may perform the bi-section selection method. In some embodiments, after performing the bi-section selection method to locate an intermediate frequency band, the control unit may also interpolate a location of the reference frequency with respect to the intermediate frequency band and a first frequency band adjacent to the intermediate frequency band to determine the desired frequency band.

Advantageously, the control unit may select the desired frequency band without using an arithmetic unit, which may include an adder or subtractor, or digital logic that requires an external clock. Additionally, the control unit may also perform a same number of comparisons between the frequency of the output signal and the frequency of the reference signal and/or a same number of steps for a given number of frequency bands. Performing the same number of comparisons and/or steps may provide predictable lock-in times for the frequency synthesizer circuit.

Embodiments of the present invention will be explained with reference to the accompanying drawings.

Figure 1:
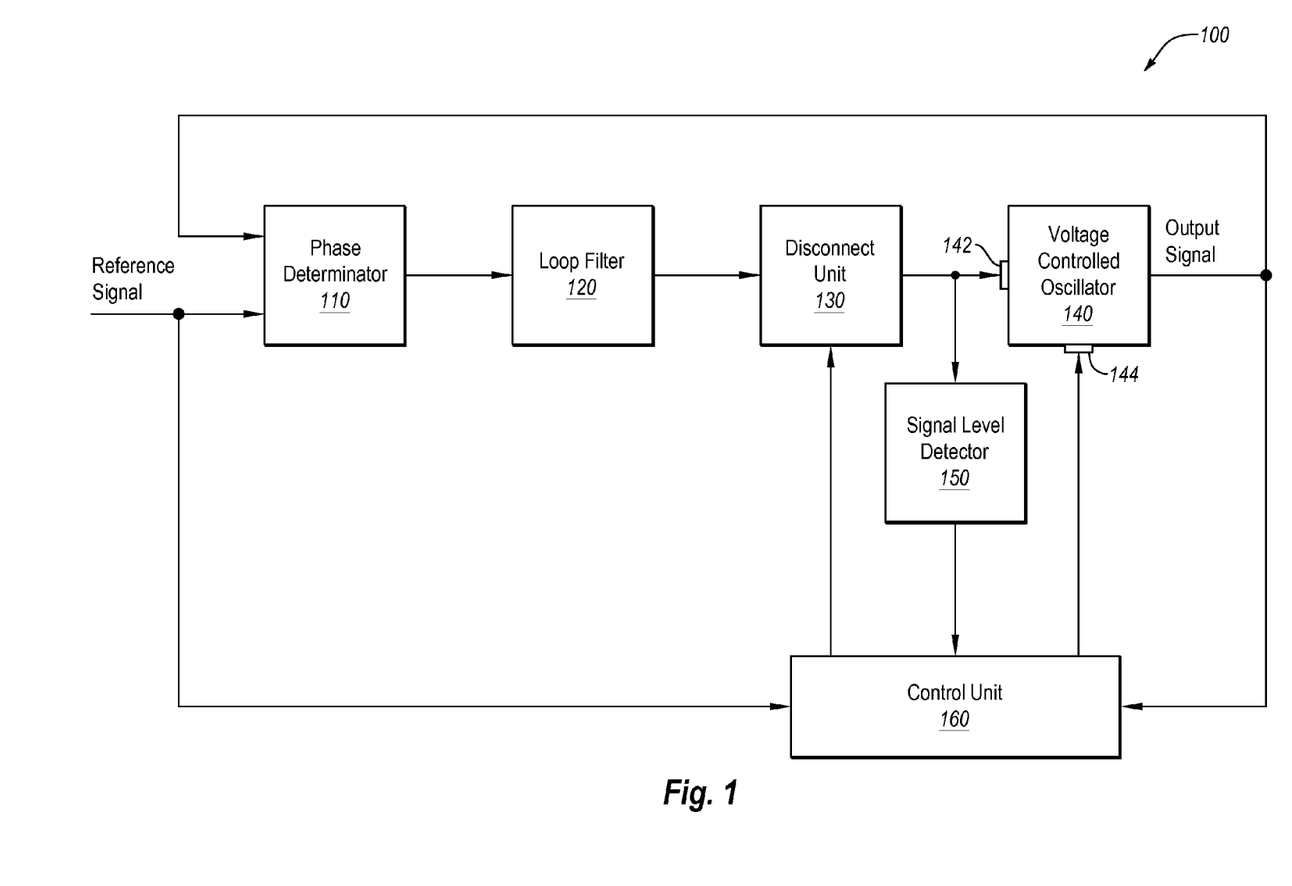
FIG. 1 is a block diagram of an example frequency synthesizer circuit.

FIG. 1 is a block diagram of an example frequency synthesizer circuit 100 (hereinafter "circuit 100"), arranged in accordance with at least some embodiments described herein. The circuit 100 may include a phase determinator 110, a loop filter 120, a disconnect unit 130, a VCO 140, a signal level detector 150, and a control unit 160.

The circuit 100 may be configured to generate an output signal that approximates a reference signal. The circuit 100 may operate in two modes to generate the output signal, a coarse tuning mode and a fine tuning mode. During the coarse tuning mode, the circuit 100 may be configured to select one of multiple frequency bands for the VCO 140. In particular, the control unit 160 may be configured to select a frequency band for the VCO 140 based on the output signal and the reference signal. The control unit 160 may select a frequency band for the VCO 140 that contains a range of frequencies that includes a reference frequency of the reference signal.

The VCO 140 may contain multiple frequency bands to increase an operating frequency range of the VCO 140 without increasing a phase noise level of the VCO 140 compared to some VCOs that do not operate at or contain multiple frequency bands. Each of the frequency bands may have a frequency range over which the VCO 140 may generate output signals with acceptable levels of phase noise. The VCO 140 may operate in one frequency band at a time and may be configured to move between frequency bands based on the desired frequencies for the output signals.

For example, the VCO 140 may have first, second, and third frequency bands that each range over 200 megahertz (MHz). The first frequency band may range from 12.2 gigahertz (GHz) to 12.4 GHz, the second frequency band may range from 12.4 GHz to 12.6 GHz, and the third frequency band may range from 12.6 GHz to 12.8 GHz. When the VCO 140 is operating within the first frequency band, the frequencies of the output signal may range from 12.2 GHz to 12.4 GHz. To generate an output signal with a frequency of 12.5 GHz, however, the second frequency band may be selected and then the output signal may be generated.

After selecting the frequency band for the VCO 140 during the coarse tuning mode, the circuit 100 may adjust the output signal until the output signal approximates the reference signal during the fine tuning mode. In particular, during the fine tuning mode, a phase of the output signal may be adjusted until the phase of the output signal approximates or is equal to a reference phase of the reference signal. The function of the individual components within the circuit 100, during the coarse tuning mode and the fine tuning mode, is now explained.

The phase determinator 110 may be configured to receive the output signal from the VCO 140 and may be further configured to receive the reference signal. The reference signal may be generated by another circuit; an oscillator, such as a crystal; or some other device. The phase determinator 110 may also be configured to generate a phase difference signal. The phase difference signal may indicate a phase difference between the reference signal and the output signal. In some embodiments, the phase determinator 110 may generate the phase difference signal during both the coarse and fine tuning modes. Alternately or additionally, the phase determinator 110 may generate the phase difference signal during the fine tuning mode and may be disabled during the coarse tuning mode. In some embodiments, the phase difference signal may be a voltage. In some embodiments, the phase determinator 110 may include a phase frequency detector and a charge pump. The phase determinator 110 may also be configured to send the phase difference signal to the loop filter 120.

The loop filter 120 may be configured to receive the phase difference signal and to filter the phase difference signal. In particular, the loop filter 120 may be configured as a low pass filter. The loop filter 120 may filter the phase difference signal when received from the phase determinator 110 during either the coarse and/or fine tuning modes. The loop filter 120 may be an analog or a digital filter. The loop filter 120 may be configured to send the filtered phase difference signal to the disconnect unit 130.

The disconnect unit 130 may be configured to perform different operations depending on whether the circuit 100 is in the coarse or fine tuning mode. During the fine tuning mode, the disconnect unit 130 may be configured to receive the filtered phase difference signal from the loop filter 120 and to send the filtered phase difference signal to a first input 142 of the VCO 140 and the signal level detector 150.

During the coarse tuning mode, the disconnect unit 130 may be configured to electrically disconnect the first input 142 of the VCO 142 from an output of the phase determinator 110 and an output of the loop filter 120. The disconnect unit 130 may also be configured to supply a first voltage to the first input 142 of the VCO 140 and to bring the first input 142 to the first voltage. The disconnect unit 130 may also be configured to supply a second voltage to the output of the loop filter 120 and to bring the output of the loop filter 120 to the second voltage. In some embodiments, the first voltage may be approximately equal to the second voltage. For example, the first voltage may be within 20% of the second voltage The disconnect unit 130 may be controlled by the control unit 160. The control unit 160 may assert or deassert a frequency band select signal sent to the disconnect unit 130 to indicate to the disconnect unit 130 when to electrically disconnect the first input 142 of the VCO 140 from or connect the first input 142 of the VCO 140 with the outputs of the phase determinator 110 and the loop filter 120. Alternately or additionally, the control unit 160 may indicate to the disconnect unit 130 when to supply the first and second voltages and may determine the levels of the first and second voltages.

In some embodiments, the disconnect unit 130 may be configured to bring the input 142 of the VCO 140 to the first voltage faster than the disconnect unit 130 brings the output of the loop filter 120 to the second voltage. The disconnect unit 130 may bring the input 142 of the VCO 140 to the first voltage faster than bringing the output of the loop filter 120 to the second voltage because before beginning the course tuning method the input 142 of the VCO 140 may be brought to the first voltage while the output of the loop filter 120 may be at any voltage to begin the course tuning method. The output of the loop filter 120 may be brought to the second voltage by the end of the course tuning method to provide approximately equivalent voltages at the output of the loop filter 120 and the input 142 when the disconnect unit 130 electrically connects them.

The VCO 140 may include the first input 142 coupled to the disconnect unit 130 and a second input 144 coupled to the control unit 160. The VCO 140 may be configured to receive the filtered phase difference signal and a voltage from the disconnect unit 130 at the first input 142. The VCO 140 may further be configured to receive a frequency band signal from the control unit 160 at the second input 144.

The VCO 140 may also be configured to generate the output signal. During the fine tuning mode, the VCO 140 may generate the output signal based on a value of the frequency band signal at the second input 144 and the filtered phase difference signal at the first input 142. More specifically, the VCO 140 may generate an output signal at a frequency based on the filtered phase difference signal within a frequency band indicated by the value of the frequency band signal.

During the coarse tuning mode, the VCO 140 may generate the output signal based on a value of the frequency band signal at the second input 144 and the voltage at the first input 142. For different values of the frequency band signal, the VCO 140 may select a different frequency band in which to operate. For example, a first value on the frequency band signal may cause the VCO 140 to select a first frequency band in which to operate. In some embodiments, the first frequency band ranges from 12.2 GHz to 12.4 GHz. A second value on the frequency band signal may cause the VCO 140 to select a second frequency band in which to operate. In some embodiments, the second frequency band ranges from 12.4 to 12.6 GHz. The voltage at the input 142 may indicate the frequency within the frequency band at which the VCO 140 generates the output signal.

Consider an example in which the first frequency band ranges from 12.3 GHz to 12.5 GHz and the second frequency band ranges from 12.5 GHz to 12.7 GHz. In response to a value of 0.5 VDD on the first input 142, where VDD is a supply voltage of the VCO 140, the VCO 140 may generate the output signal with a frequency of 12.4 GHz for the first frequency band, for example. Whereas, for the second frequency band and a value of 0.5 VDD on the first input 142, the VCO 140 may generate the output signal with a frequency of 12.6 GHz. The VCO 140 may be configured to send the output signal to the control unit 160 and the phase determinator 110.

The signal level detector 150 may be configured to receive the filtered phase difference signal from the disconnect unit 130. During the fine tuning mode, the signal level detector 150 may be configured to detect when the filtered phase difference signal is outside a predetermined range. When the signal level detector 150 detects that the filtered phase difference signal is outside the predetermined range, the signal level detector 150 may send an out of range signal to the control unit 160.

The predetermined range used by the signal level detector 150 may depend on the operating characteristics of the VCO 140. In general, a VCO may not have a similar reaction to all acceptable voltage levels at an input of the VCO. For example, a change in a voltage level near an edge of a voltage range of the VCO may produce less of a change in frequency than a similar change to the voltage level near the middle of the voltage range of the VCO. The predetermined range used by the signal level detector 150 may be determined based on a range of voltage levels that produce larger changes in a frequency of an output signal as compared to voltage levels outside the predetermined range. For example, the predetermined range may be between 0.2 VDD and 0.8 VDD. In some embodiments, the predetermined range of the signal level detector 150 may be set and/or changed based on a signal sent to the signal level detector 150.

The control unit 160 may be configured to receive the reference signal, the output signal, and the out of range signal. The control unit 160 may further be configured to send the frequency band select signal to the disconnect unit 130 and the frequency band signal to the VCO 140.

The control unit 160 may also be configured to control whether the circuit 100 is operating in the coarse or fine tuning mode. The control unit 160 may cause the circuit 100 to operate in the coarse tuning mode when the control unit 160 receives the out of range signal from the signal level detector 150 indicating that the phase difference signal is outside the predetermined range; when the control unit 160 is reset; when the control unit 160 receives an indication from an outside source, such as another circuit, to operate in the coarse tuning mode; on power-up of the circuit 100; and/or for other reasons.

During the coarse tuning mode, the control unit 160 may be configured to select a frequency band for the VCO 140 whose frequency range includes the reference frequency of the reference signal. The control unit 160 may select the frequency band for the VCO 140 by performing a bi-section selection method. During the bi-section selection method, the control unit 160 may vary the value of the frequency band signal sent to the VCO 140 causing the VCO 140 to select different frequency bands in which to operate.

For each frequency band selected by the VCO 140, the control unit 160 may compare the output signal with the reference signal. Based on the comparison, the control unit 160 may change the value of the frequency band signal. The control unit 160 may use a bi-section selection method to select an intermediate frequency band. After selecting the intermediate frequency band, the control unit 160 may interpolate a location of the reference frequency with respect to the intermediate frequency band and a first frequency band adjacent to the intermediate frequency band to select the frequency band that contains a range of frequencies that includes the reference frequency. For a given number of frequency bands, the control unit 160 may perform the same number of steps regardless of the frequency band being selected within the given number of frequency bands. By performing the same number of steps, the circuit 100 may provide predictable lock-in times. The bi-section selection method is described in greater detail with respect to FIG. 5.

During the coarse tuning mode and before performing the bi-section selection method, the control unit 160 may assert the frequency band select signal to cause the disconnect unit 130 to electrically disconnect the first input 142 of the VCO 140 and the output of the loop filter 120. In some embodiments, the control unit 160 may wait to begin the bi-section selection method until after the disconnect unit 130 has brought the first input 142 of the VCO 140 to the first voltage. By electrically disconnecting the first input 142 of the VCO 140 and the output of the loop filter 120 and bringing the first input 142 to the first voltage, the control unit 160 may allow for any change in the frequency of the output signal to be due to a change of the frequency band signal or some other factor controlled by the control unit 160. By allowing the control unit 160 to control the change of the frequency of the output signal, the control unit 160 may better select the frequency band for the VCO 140 during the coarse tuning method.

After selecting the frequency band for the VCO 140 that contains the range of frequencies that includes the reference frequency, the control unit 160 may deassert the frequency band select signal causing the disconnect unit 130 to electrically connect the input 142 with the output of the phase determinator 110 and the loop filter 120. By providing the output of the loop filter 120 with the second voltage that approximates the first voltage on the input 142 of the VCO 140, when the disconnect unit 130 electrically connects the input 142 with the output of the loop filter 120, the voltage on the input 142 may not change by a large degree. If the voltage on the input 142 changed by a large degree, the signal level detector 150 may detect that the voltage level at the input 142 is outside the predetermined range when the phase difference signal is actually inside the predetermined range causing a false positive. A false positive reading by the signal level detector 150 may lead to the control unit 160 causing the circuit 100 to enter the coarse tuning mode.

Upon deasserting the frequency band select signal, the circuit 100 may enter the fine tuning mode. During the fine tuning mode, the control unit 160 may send the value of the selected frequency band to the VCO 140 and monitor for an out of range signal from the signal level detector 150 indicating that the reference frequency of the reference signal may be near the edges or out of the range of the currently selected frequency band and causing the circuit 100 to enter the coarse tuning mode.

In some embodiments, the circuit 100 may contain additional elements. For example, the circuit 100 may contain a divider circuit that divides the output signal. Alternately or additionally, the circuit 100 may contain other elements.

Figure 2:
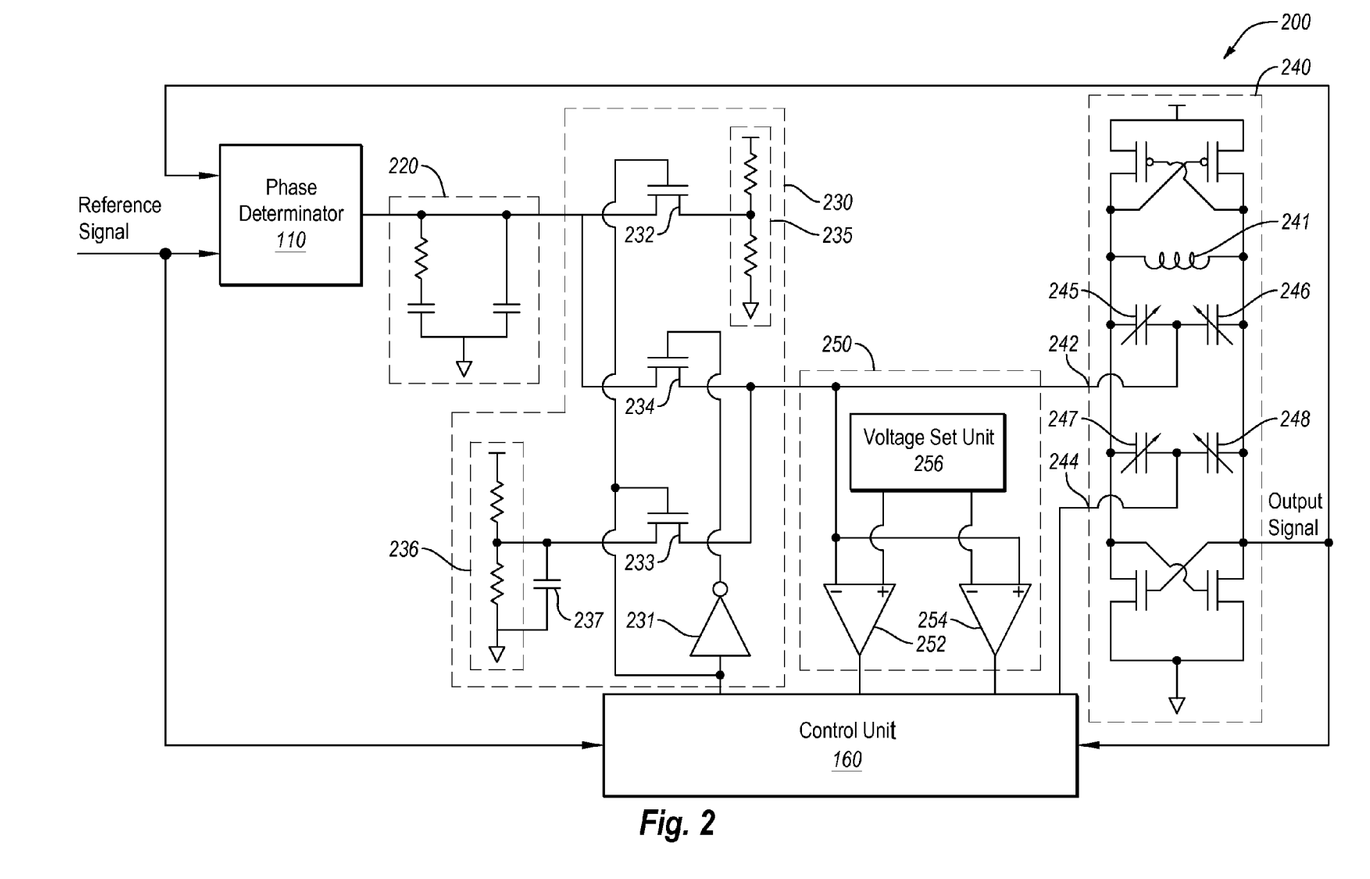
FIG. 2 is a block diagram of another example frequency synthesizer circuit.

FIG. 2 is a block diagram of another example frequency synthesizer circuit 200 (hereinafter "circuit 200"), arranged in accordance with at least some embodiments described herein. The circuit 200 may include the phase determinator 110, a loop filter 220, a disconnect unit 230, a VCO 240, a signal level detector 250, and the control unit 160. The loop filter 220, the disconnect unit 230, the VCO 240, and the signal level detector 250 may be similar to and/or correspond to the loop filter 120, the disconnect unit 130, the VCO 140, and the signal level detector 150, respectively, of FIG. 1.

The circuit 200 may be configured to generate an output signal that approximates a reference signal using a coarse tuning mode and a fine tuning in a similar manner as described above with respect to circuit 100 of FIG. 1.

A description of the phase determinator 110 and the control unit 160 is provided with respect to FIG. 1 above.

The loop filter 220 may be configured to receive the phase difference signal from the phase determinator 110. The loop filter 220 may also be configured to filter the phase difference signal. In particular, the loop filter 220 may be configured as a low pass filter and may contain various passive and/or active circuit elements. As illustrated in FIG. 2, the loop filter 220 may include various capacitors and a resistor configured as a low pass filter to remove higher frequencies components from the phase difference signal to generate a filtered phase difference signal. The filtered phase difference signal may be sent to the disconnect unit 230.

The disconnect unit 230 may be configured to perform different operations depending on whether the circuit 200 is in the coarse or fine tuning mode. During the fine tuning mode, the disconnect unit 230 may be configured to receive the filtered phase difference signal from the loop filter 220 and to send the filtered phase difference signal to the signal level detector 250 and to a first input 242 of the VCO 240.

During the coarse tuning mode, a frequency band select signal sent to the disconnect unit 230 from the control unit 160 may be asserted. Within the disconnect unit 230, the frequency band select signal may be inverted by an inverter 231 and the inverted frequency band select signal may place a voltage on a gate of a transistor 234 to close a channel of the transistor 234. By closing the channel of the transistor 234, the first input 242 of the VCO 240 may be electrically disconnected from the loop filter 220 and the output of the phase determinator 110.

The asserted frequency band select signal may also place a voltage on the gates of the transistors 232 and 233 to open channels of the transistors 232 and 233. With the channels of the transistors 232 and 233 opened, a first voltage supply 236 may provide a first voltage to the first input 242 and a second voltage supply 235 may provide a second voltage to the loop filter 230.

The first and second voltages supplies 235 and 236 are illustrated as resistive voltage dividers in FIG. 2. In other embodiments, the first and second voltage supplies 235 and 236 may include other types of active or passive circuit elements to supply a voltage or may include integrated circuits. Alternately or additionally, the first and second voltage supplies 235 and 236 may include variable voltage supplies controlled by the control unit 160 or some other circuit.

A capacitor 237 may be coupled to the first input 242 to reduce a period to bring the first input 242 to the first voltage. Having the first capacitor 237 coupled to the first input 242 may also allow the first input 242 to be brought to the first voltage faster than the loop filter 220 is brought to the second voltage. In some embodiments, the first voltage may be approximately equal to the second voltage. For example, a level of the first voltage may be within 20% of a level of the second voltage.

During the fine tuning mode, the frequency band select signal may be deasserted. When deasserted, the frequency band select signal may close the channels of the transistors 232 and 233 to disconnect the loop filter 220 from the second voltage supply 235 and to disconnect the first input 242 from the first voltage supply 236. The frequency band select signal may also be inverted by the inverter 231. When inverted, the deasserted frequency band select signal may open the channel of the transistor 234 electrically connecting the input 242 with the loop filter 220 and the output of the phase determinator 110.

The VCO 240 may include the first input 242 coupled to the disconnect unit 230 and a second input 244 coupled to the control unit 160. The VCO 240 may be configured to receive the filtered phase difference signal and a voltage from the disconnect unit 230 at the first input 242. The first input 242 may be coupled to first and second varactors 245 and 246. The first and second varactors 245 and 246 may change their capacitance based on a voltage level of the filtered phase difference signal and of the voltage.

The VCO 240 may be further configured to receive a frequency band signal from the control unit 160 at the second input 244. The second input 244 may be coupled to third and fourth varactors 247 and 248. The third and fourth varactors 247 and 248 may change their capacitance based on the value of the frequency band signal. For example, each of the third and fourth varactors 247 and 248 may be arrays of varactors and the frequency band signal may be a digital signal of one or more bits. The capacitance of the third and fourth varactors 247 and 248 may be adjusted based on the digital value of the frequency band signal.

The VCO 240 may also be configured to generate the output signal based on an inductance value and a capacitance value of an LC circuit formed by an inductor 241 and the first, second, third, and fourth varactors 245, 246, 247, and 248. To change a phase and/or a frequency of the output signal, the capacitance value of the LC circuit may be changed. The capacitance of the LC circuit may be changed by adjusting the capacitance of one or more of the first, second, third, and fourth varactors 245, 246, 247, and 248.

During the fine tuning mode, the capacitances of the third and fourth varactors 247 and 248 may be maintained static and the capacitances of the first and second varactors 245 and 246 may be varied based on a varying voltage of the filtered phase difference signal to change a phase and/or frequency of the output signal. During the coarse tuning mode, the capacitances of the first and second varactors 245 and 246 may be static and the capacitances of the third and fourth varactors 247 and 248 may be varied based on the value of the frequency band signal to change a phase and/or frequency of the output signal.

The signal level detector 250 may be configured to receive the filtered phase difference signal from the disconnect unit 230. During the fine tuning mode, the signal level detector 250 may be configured to detect when the filtered phase difference signal is outside a predetermined range. The signal level detector 250 may detect when the filtered phase difference signal is outside the predetermined range by comparing the filtered phase difference signal to voltages at the ends of the predetermined range. In particular, the signal level detector 250 may compare the filtered phase difference signal to voltages at the ends of the predetermined range using first and second comparators 252 and 254.

The first comparator 252 may receive a lowest voltage in the predetermined range from a voltage set unit 256 and compare the lowest voltage to the filtered phase difference signal. The first comparator 252 may indicate to the control unit 160 when the filtered phase difference signal is lower than the lowest voltage in the predetermined range.

The second comparator 254 may receive a highest voltage in the predetermined range from the voltage set unit 256 and compare the highest voltage to the filtered phase difference signal. The second comparator 254 may indicate to the control unit 160 when the filtered phase difference signal is higher than the highest voltage in the predetermined range.

In some embodiments, the voltage set unit 256 may be configurable to allow the predetermined range to be adjusted. For example, an outside circuit and/or the control unit 160 may adjust the predetermined range using the voltage set unit 256. The voltage set unit 256 may be either analog or digital.

When the control unit 160 receives an indication from either the first or second comparators 252 and 254 that the filtered phase difference is outside the predetermined range, the control unit 160 may cause the circuit 200 to enter the coarse tuning mode.

The circuit 200 as illustrated in FIG. 2 may include various other active or passive circuit elements or other integrated circuits. For example, in some embodiments, the VCO 240 may include one or more additional transistors between the inductor 241 and a voltage supply for the VCO 240.

Figure 3:
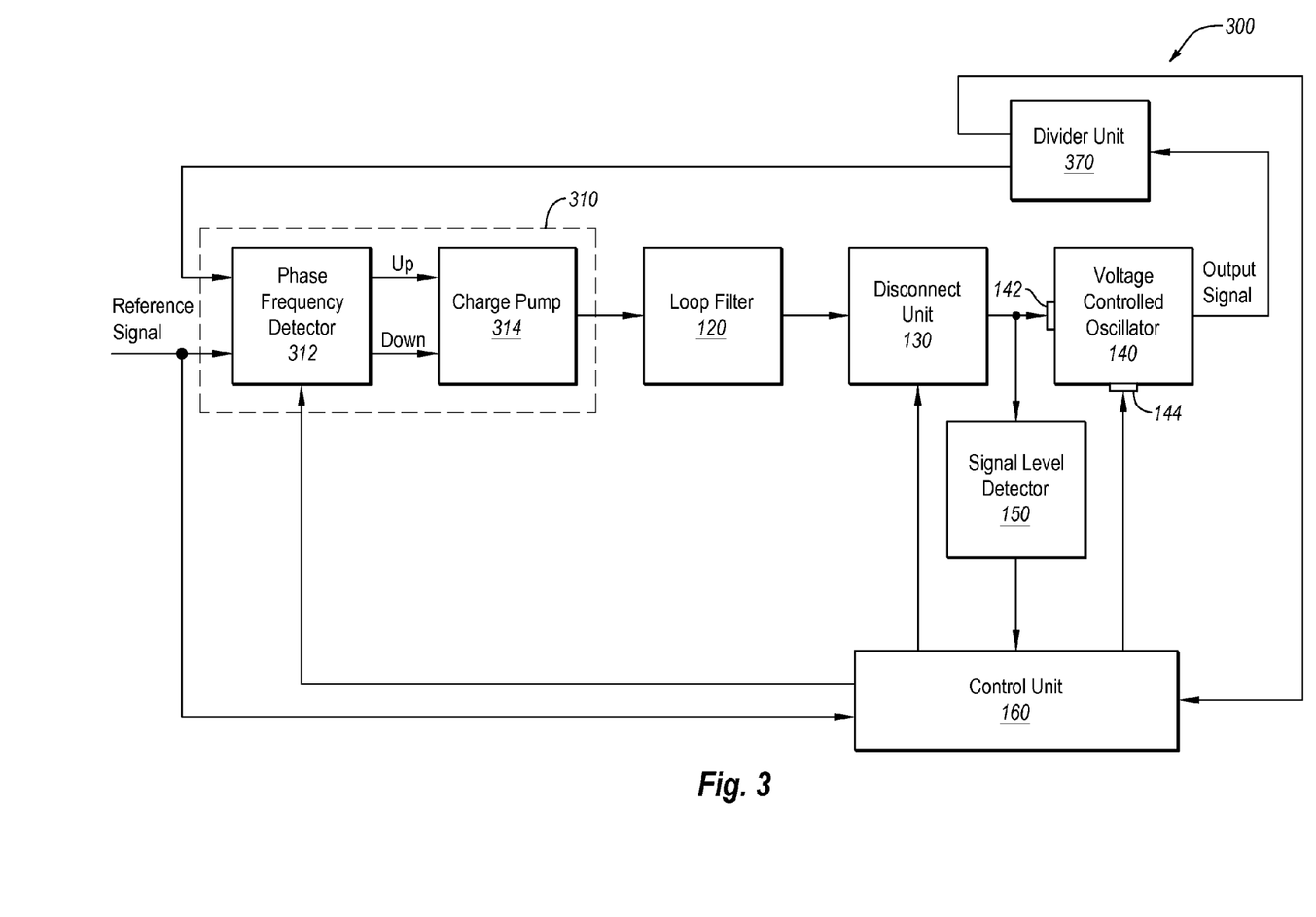
FIG. 3 is a block diagram of another example frequency synthesizer circuit.

FIG. 3 is a block diagram of another example frequency synthesizer circuit 300 (hereinafter "circuit 300"), arranged in accordance with at least some embodiments described herein. The circuit 300 may include a phase determinator 310, the loop filter 120, the disconnect unit 130, the VCO 140, the signal level detector 150, the control unit 160, and a divider unit 370. The phase determinator 310 may be similar to and/or correspond to the phase determinator 110 of FIG. 1.

A description of the loop filter 120, the disconnect unit 130, the VCO 140, the signal level detector 150, and the control unit 160 is provided with respect to FIG. 1 above.

The phase determinator 310 may include a phase frequency detector 312 coupled to a charge pump 314. The phase frequency detector 312 may be configured to receive the output signal from the VCO 140 and to receive the reference signal. The phase frequency detector 312 may also be configured to detect a difference between a phase of the output signal and a phase of the reference signal. When the phase of the reference signal is leading the phase of the output signal, the phase frequency detector 312 may assert an up signal that is sent to the charge pump 314. When the phase of the reference signal is lagging the phase of the output signal, the phase frequency detector 312 may assert a down signal that is sent to the charge pump 314.

The charge pump 314 may receive the up and down signals from the phase frequency detector 312. The up signal when asserted may steer current into a capacitor within the charge pump 314. The down signal when asserted may steer current out of the capacitor. As a result, the voltage on the capacitor may be dependent on the phase difference between the reference signal and the output signal. The voltage on the capacitor may be output to the loop filter 120 as the phase difference signal.

The divider unit 370 may be configured to receive the output signal and to divide the output signal by a predetermined quotient. For example, the divider unit 370 may divide an example 10 GHz output signal by 10, thereby outputting a divided output signal having a frequency of 1 GHz. The divider unit 370 may send the divided output signal to the control unit 160 and the phase frequency detector 312. In some embodiments, the divider unit 370 may be used in configurations where the output signal has a frequency outside a frequency range of the control unit 160 and/or the phase determinator 310. In some embodiments, the reference signal supplied to the phase determinator 310 may be multiplied. For example, the reference signal may be multiplied by a number similar to the quotient used by the divider 370.

Figure 4:
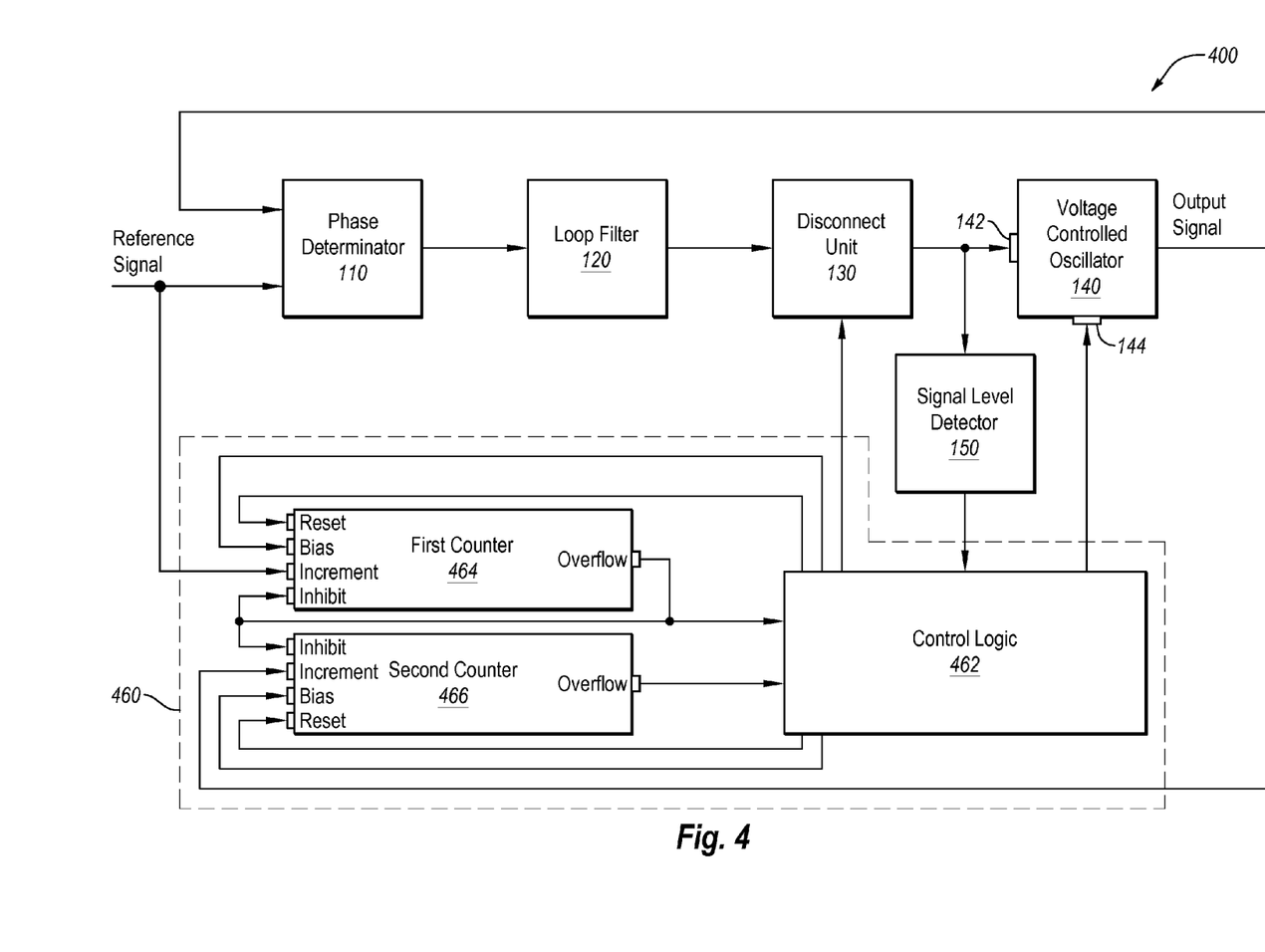
FIG. 4 is a block diagram of another example frequency synthesizer circuit.

FIG. 4 is a block diagram of another example frequency synthesizer circuit 400 (hereinafter "circuit 400"), arranged in accordance with at least some embodiments described herein. The circuit 400 may include the phase determinator 110, the loop filter 120, the disconnect unit 130, the VCO 140, the signal level detector 150, and a control unit 460. The control unit 460 may be similar to and/or correspond to the control unit 160 of FIG. 1 and may include a first counter 464, a second counter 466, and control logic 462.

A description of the phase determinator 110, the loop filter 120, the disconnect unit 130, the VCO 140, and the signal level detector 150 is provided with respect to FIG. 1 above.

The control unit 460 may be configured to control whether the circuit 400 is operating in a coarse tuning mode or a fine tuning mode. The control unit 460 may cause the circuit 400 to operate in the coarse tuning mode when the control unit 460 receives the out of range signal from the signal level detector 150 indicating that a phase difference signal from the phase determinator 110 is outside a predetermined range; when the control unit 460 is reset; when the control unit 460 receives an indication from an outside source, such as another circuit, to operate in the coarse tuning mode; on power-up of the circuit 400; and/or for other reasons.

During the coarse tuning mode, the control unit 460 may be configured to select, for the VCO 140, a frequency band that has a frequency range that includes the reference frequency of the reference signal. The control unit 460 may select the frequency band for the VCO 140 by performing a bi-section selection method. During the bi-section selection method, the control unit 460 may vary the value of the frequency band signal sent to the VCO 140 causing the VCO 140 to select different frequency bands in which to operate.

To select the frequency band sent to the VCO 140, the control unit 460 may compare the output signal with the reference signal using the first and second counters 464 and 466. A description of the first and second counters 464 and 466 and how the control logic 462 may compare the output signal with the reference signal using the first and second counters 464 and 466 follows.

The first counter 464 may be configured to receive the reference signal at an increment input and count rising and/or falling edges of the reference signal. When the first counter 464 counts a predetermined number of the rising and/or falling edges of the reference signal, the first counter 464 may send a first overflow signal out an overflow output to the control logic 462. The first counter 464 may also send the first overflow signal to an inhibit input of the first counter 464 and an inhibit input of the second counter 466.

The second counter 466 may be configured to receive the output signal at an increment input and count rising and/or falling edges of the output signal. When the second counter 466 counts a predetermined number of the rising and/or falling edges of the output signal, the second counter 466 may send a second overflow signal out an overflow output to the control logic 462. The predetermined number of the rising and/or falling edges of the output signal counted by the second counter 466 to generate the second overflow signal may be the same as the predetermined number of the rising and/or falling edges of the reference signal counted by the first counter 464 to generate the first overflow signal.

When the first and second counters 464 and 466 receive the first overflow signal at their respective inhibit inputs, the first counter 464 may stop counting the rising and/or falling edges of the reference signal and the second counter 464 may stop counting the rising and/or falling edges of the output signal.

The control logic 462 may be configured to receive the first overflow signal and the second overflow signal from the first and second counters 464 and 466 respectively. Based on the receipt of the first and second overflow signals, the control logic 462 may determine whether a frequency of the output signal is faster or slower than a reference frequency of the reference signal. Based on the frequency of the output signal being faster or slower than the reference frequency of the reference signal, the control logic 462 may select the frequency band in which the VCO 140 may operate.

For example, the control logic 462 receiving only the first overflow signal from the first counter 464 may indicate that the output signal is slower than the reference signal because the control logic 462 receiving only the first overflow signal may indicate that the second counter 466 was inhibited by the first overflow signal before the second counter 466 counted the predetermined number of rising and/or falling edges of the output signal to send the second overflow signal. As another example, the control logic 462 receiving only the second overflow signal from the first counter 464 or the first and second overflow signals from the first and second counters 464 and 466 respectively may indicate that the output signal is faster than the reference signal because the second counter 466 sent the second overflow signal to the control logic 462 before being inhibited by the first overflow signal from the first counter 464.

The first and second counters 464 and 466 may include reset inputs coupled to the control logic 462 through which the control logic 462 may reset the first and second counters 464 and 466. After making a comparison of the output signal with the reference signal using the first and second counters 464 and 466, the control logic 462 may reset the first and second counters 464 and 466 using their respective reset inputs.

In some embodiments, while performing the bi-section selection method to select the frequency band for the VCO 140, the control unit 460 may select an intermediate frequency band. After selecting the intermediate frequency band, the control unit 460 may interpolate a location of the reference frequency with respect to the intermediate frequency band and a first frequency band adjacent to the intermediate frequency band to select the frequency band that has the frequency range that includes the reference frequency of the reference signal. To interpolate the location of the reference frequency with respect to the intermediate frequency band and the first frequency band, the control logic 462 may bias either the first counter 464 and/or the second counter 466, using respective biasing inputs of the first and second counters 464 and 466 after resetting the first and second counters 464 and 466. After biasing the first and/or second counter 464 and 466, the control logic 462 may use the first and/or second overflow signals to determine whether the frequency of the output signal is faster or slower than the reference frequency of the reference signal.

The control logic 462 may determine which of the first and second counters 464 and 466 to bias based on whether the frequency of the output signal of the VCO 140 at the intermediate frequency band is faster or slower than the reference frequency of the reference signal. When the frequency of the output signal is faster than the reference frequency of the reference signal, the control logic 462 may bias the first counter 464 by initializing the count of the first counter 464 to half the count difference between two frequency bands of the VCO 140. When the frequency of the output signal is slower than the reference frequency of the reference signal, the control logic 462 may bias the second counter 466 by initializing the count of the second counter 466 to half the count difference between two frequency bands of the VCO 140.

After biasing either the first or second counter 464 and 466 or both, the control logic 462 may interpolate the location of the reference frequency with respect to the intermediate frequency band and the first frequency band based on which of the first and second counters 464 and 466 first reach the predetermined number of rising and/or falling edges of their respective signals. For example, when the first frequency band contains frequencies lower than the intermediate frequency band, and the reference signal or the output signal that was biased is still slower after the biasing, the control logic 462 may select the first frequency band as the frequency band for use by the VCO 140 when the circuit 400 is in the fine tuning mode. When the first frequency band contains frequencies lower than the intermediate frequency band and the reference signal or output signal that was biased is faster after the biasing, the control logic 462 may select the intermediate frequency band as the frequency band for use by the VCO 140 when the circuit 400 is in the fine tuning mode.

In some embodiments, the circuit 400 may contain components other than those illustrated. For example, the circuit 400 may contain a divider unit, such as the divider unit 370 of FIG. 3. Alternately or additionally, the control unit 460 may be used in place of the control units 160 of FIGS. 1, 2 and/or 3. For example, with respect to FIG. 2, the control logic 462 of the control unit 460 may receive various signals from and/or send various signals to control the signal level detector 250, the disconnect unit 240, and the VCO 240.

Figure 5:
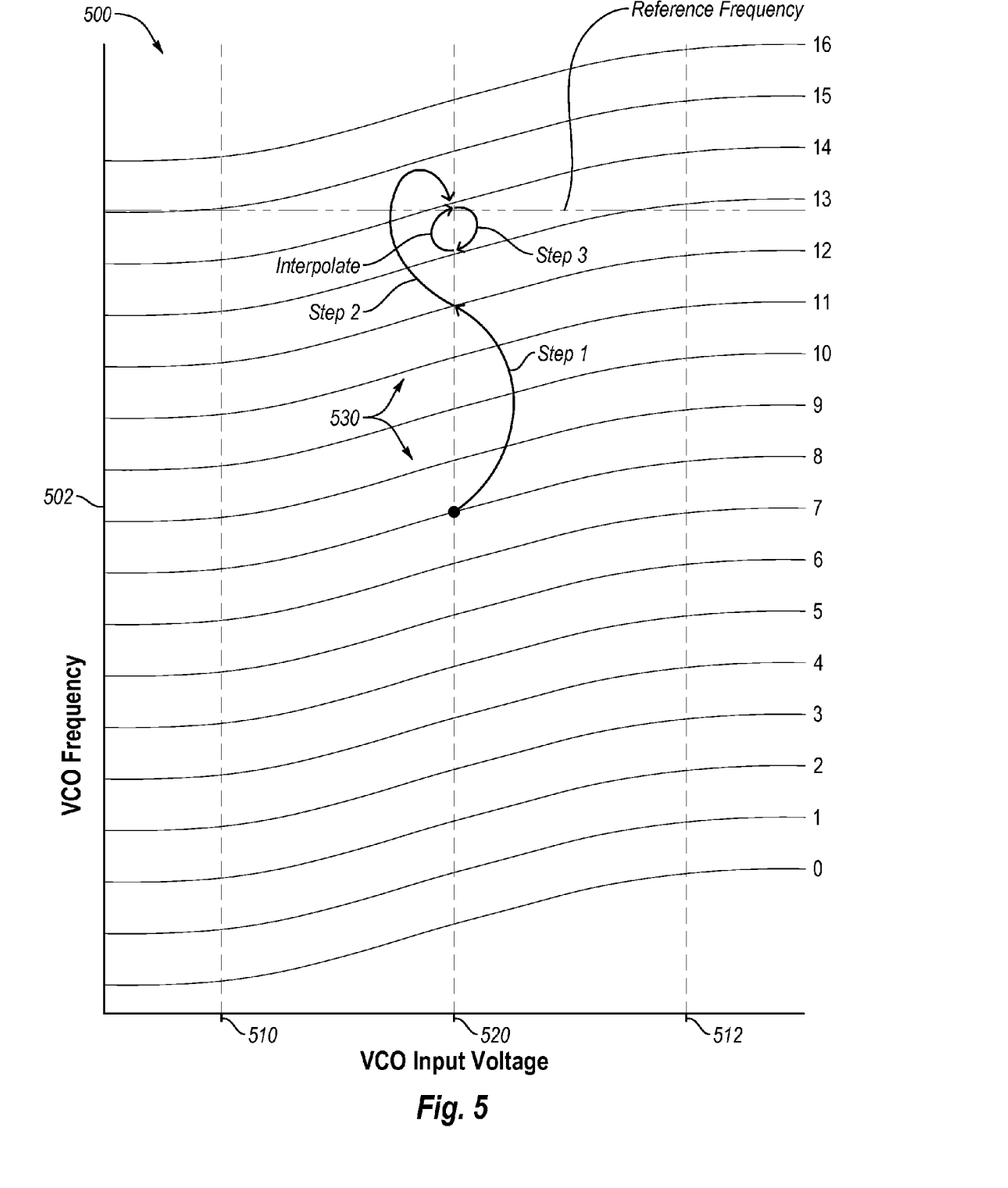
FIG. 5 is a diagram illustrating coarse tuning of a frequency synthesizer circuit.

FIG. 5 is a diagram 500 illustrating coarse tuning of a frequency synthesizer circuit, arranged in accordance with at least some embodiments described herein. The diagram 500 includes a graph 502 of frequency bands of a VCO with an x-axis representing VCO Input Voltage and a y-axis representing VCO frequency, where the value of the VCO frequency is dependent on the VCO input voltage and the selected frequency band. In the illustrated embodiment, the graph 502 includes seventeen frequency bands labeled 0, 1, 2, 3, 4, 5, 6, 7, 8, 9, 10, 11, 12, 13, 14, 15, and 16. Each of the frequency bands contain a range of frequencies that differ from the ranges of frequencies of the other frequency bands.

As depicted, the graph 502 also includes VCO input voltages 510 and 512 that represent minimum and maximum voltages, respectively, of a predetermined range of voltages for the VCO that produce a greater change in the VCO frequency as compared to changes in voltages outside the predetermined range of voltages. The VCO input voltages 510 and 512 may correspond to the voltage levels used by the signal level detector 150 as described with respect to FIG. 1. The graph 502 further includes a middle voltage 520 that may correspond to the input voltage sent to the first input 142 by the disconnect unit 130 as described with respect to FIG. 1 during a coarse tuning mode. The graph 502 additionally includes a reference frequency.

The diagram 500 illustrates various steps 530 that may be undertaken by the frequency synthesizer circuit during a coarse tuning mode to select a desired frequency band for the VCO to use during a fine tuning mode of the frequency synthesizer circuit. For example, the frequency synthesizer circuit may perform a bi-section selection method to select the desired frequency band.

The basic implementation of the bi-section selection method includes multiple steps that repeat various sub-steps. During a first sub-step of a step, a comparison frequency band is selected. During a first step, the comparison frequency band may be a middle frequency band of the multiple frequency bands of the VCO. During subsequent steps, the comparison frequency band may be a selected frequency band from a range of frequency bands from a previous step.

During a second sub-step, an output frequency of an output signal of the VCO when operating in the comparison frequency band is compared to the reference frequency. When the output frequency is greater than the reference frequency, then a range of frequency bands below the comparison frequency band are selected for the third sub-step. When the output frequency is less than the reference frequency then a range of frequency bands above the comparison frequency band are selected for the third sub-step.

During a third sub-step, a frequency band in the middle of the range of frequency bands is identified as the selected frequency band. The bi-section selection method may then move to the next step where the first, second, and third sub-steps are repeated.

The bi-section selection method may be performed until the selected frequency band in the third sub-step of a step is next to a selected comparison frequency band in an immediately preceding step thereby indicating that the reference frequency is within a frequency band either above or below the selected frequency band.

After performing the bi-section selection method, an interpolation may be performed. During the interpolation, the selected frequency band may be designated as an intermediate frequency band. After obtaining an intermediate frequency band, the output frequency at the intermediate frequency band is compared to the reference frequency to determine if the reference frequency is above or below the output frequency at the intermediate frequency band. When the reference frequency is above the output frequency at the intermediate frequency band, a frequency band above the intermediate band is selected as an interpolating frequency band. When the reference frequency is below the output frequency at the intermediate frequency band, a frequency band below the intermediate band is selected as the interpolating frequency band.

A location of the reference frequency with respect to the intermediate frequency band and the interpolating frequency band may be interpolated. When the reference frequency is closer to the intermediate frequency band, the intermediate frequency band may be the desired frequency band. When the reference frequency is closer to the interpolating frequency band, the interpolating frequency band may be the desired frequency band. In some embodiments, the interpolating frequency band may be the selected frequency band from the last step of the bi-section selection method or another frequency band adjacent to the intermediate frequency band.

A specific example of course tuning of the frequency synthesizer circuit follows using the seventeen frequency bands 0-16 illustrated in FIG. 5. During step one (labeled "Step 1" in FIG. 5), the eighth frequency band is selected as the comparison frequency band. The output frequency at the eighth frequency band at the middle voltage 520 is compared to the reference frequency and found to be lower than the reference frequency. The frequency bands eight through sixteen are selected as a range of frequency bands and the twelfth frequency band becomes the selected frequency band.

During step two (labeled "Step 2" in FIG. 5), the twelfth frequency band is selected as the comparison frequency band. The output frequency at the twelfth frequency band at the middle voltage 520 is compared to the reference frequency and found to be lower than the reference frequency. The frequency bands twelve through sixteen are selected as a range of frequency bands and the fourteenth frequency band becomes the selected frequency band.

During step three (labeled "Step 3" in FIG. 5), the fourteenth frequency band is selected as the comparison frequency band. The output frequency at the fourteenth frequency band at the middle voltage 520 is compared to the reference frequency and found to be higher than the reference frequency. The frequency bands twelve through fourteen are selected as a range of frequency bands and the thirteenth frequency band becomes the selected frequency band. The selected frequency band is next to the last comparison frequency band, i.e. the thirteenth frequency band is next to the fourteenth frequency band. Thus, the bi-section selection method ends.

During interpolation (labeled "Interpolate" in FIG. 5), the thirteenth frequency band is selected as the intermediate frequency band and a comparison between the output frequency at the thirteenth frequency band at the middle voltage 520 and the reference frequency is made to determine if the reference frequency is below or above the output frequency at the thirteenth frequency band at the middle voltage 520. Because the reference frequency is above the thirteenth frequency band, the fourteenth frequency band is selected as the interpolating frequency band. A position of the reference frequency between the thirteenth frequency band and the fourteenth frequency band is interpolated and determined to be closer to the fourteenth frequency band than the thirteenth frequency band at the middle voltage 520. The fourteenth frequency band is then selected as the desired frequency band for the VCO to use during a fine tuning mode of the frequency synthesizer circuit.

In some embodiments, the comparisons of the output frequency and the reference frequency may be performed by a control unit that includes first and second counters, similar to the control unit 460 described with respect to FIG. 4. In these and other embodiments, the first and second counters may be reset at the beginning of each step within the bi-section selection method. Alternately or additionally, interpolating between the intermediate frequency band and the interpolating frequency band may be performed by a control unit that includes first and second counters, similar to the control unit 460 described with respect to FIG. 4. In these and other embodiments, the first and second counters may be reset before one of the counters is biased to perform the interpolation.

The above described coarse tuning for selecting the desired frequency band for the fine tuning mode may be implemented with varying number of frequency bands. For example, the number of frequency bands may range from 3 to 1024. In some embodiments, the number of frequency bands may be more than 1024. In some embodiments, a number of comparisons between the output frequency and the reference frequency for a given number of frequency bands may be same. Performing the same number of comparisons may provide predictable lock-in times for the frequency synthesizer circuit. Furthermore, performing an interpolation may allow for a selection of a frequency band with a middle band frequency that is closer to the reference frequency. By providing a frequency band with a middle band frequency closer to the reference frequency, the frequency synthesizer circuit may lose lock on the reference frequency, when the reference frequency varies, less often than a frequency synthesizer circuit that does not perform interpolation.

The above described coarse tuning for selecting the desired frequency band for the fine tuning mode may be implemented, in some embodiments, by a frequency synthesizer circuit, such as the frequency synthesizer circuit 100, 200, 300, or 400 of FIG. 1, 2, 3, or 4 respectively. With respect to the above described steps and phases used to select the desired frequency band, various phases and/or steps may be added or removed depending on the desired implementation.

Figure 6:
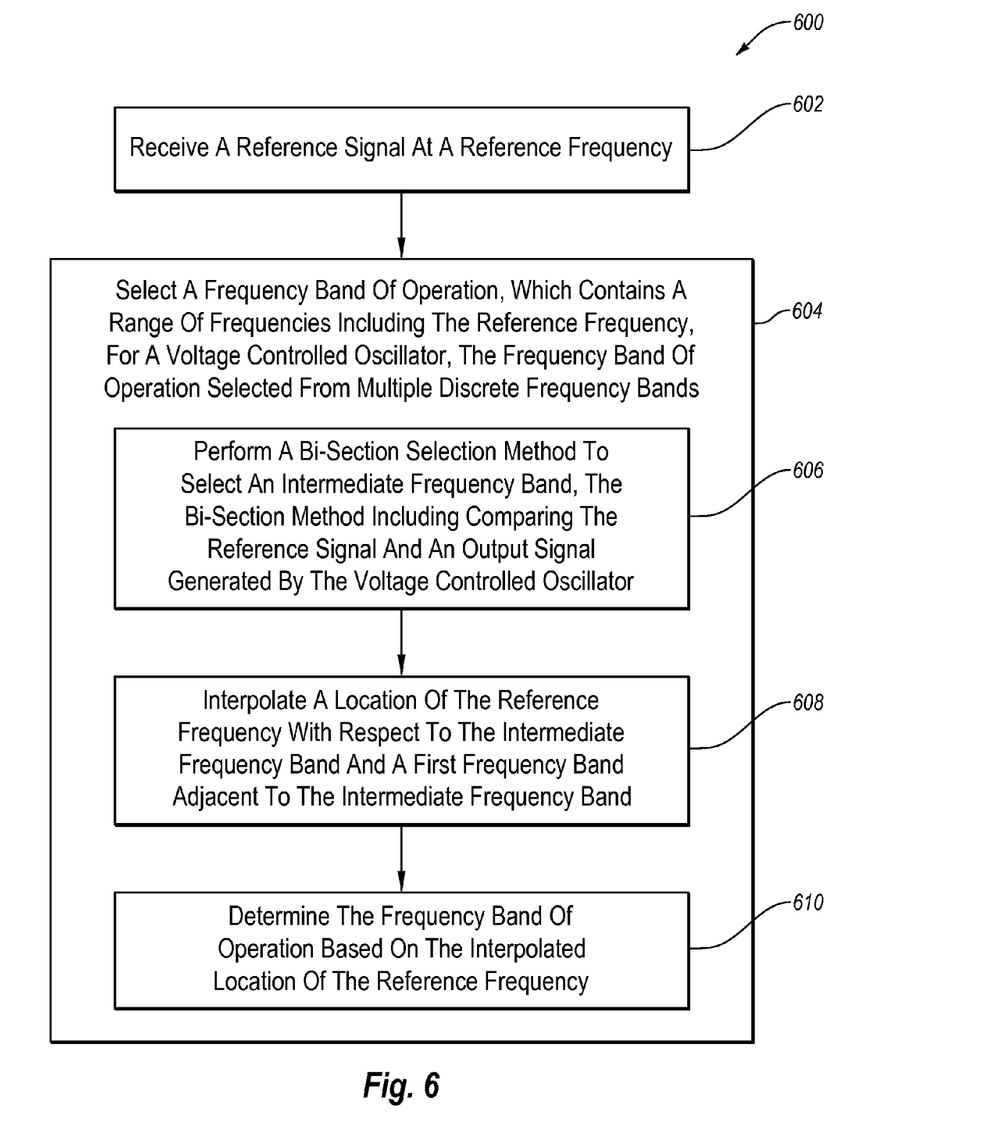
FIG. 6 is a flow chart of an example method of tuning a frequency synthesizer circuit.

FIG. 6 is a flow chart of an example method 600 of tuning a frequency synthesizer circuit, arranged in accordance with at least some embodiments described herein. The method 600 may be implemented, in some embodiments, by a frequency synthesizer circuit, such as the frequency synthesizer circuit 100, 200, 300, or 400 of FIG. 1, 2, 3, or 4 respectively. Although illustrated as discrete blocks, various blocks may be divided into additional blocks, combined into fewer blocks, or eliminated, depending on the desired implementation. The method 600 may begin at block 602, where a reference signal at a reference frequency may be received.

In block 604, a frequency band of operation may be selected, which contains a range of frequencies including the reference frequency, for a voltage controlled oscillator. The frequency band of operation may be selected from multiple discrete frequency bands. Selecting the frequency band of operation may include blocks 606, 608, and 610.

In block 606, a bi-section selection method may be performed to select an intermediate frequency band, the bi-section selection method including comparing the reference signal and an output signal generated by the voltage controlled oscillator. In some embodiments, comparing the reference signal and the output signal may include comparing a first overflow signal of a first counter configured to count edges of the reference signal with a second overflow signal of a second counter configured to count edges of the output signal.

In block 608, a location of the reference frequency may be interpolated with respect to the intermediate frequency band and a first frequency band adjacent to the intermediate frequency band. In some embodiments, the interpolating the location of the reference frequency may include biasing either the first counter or the second counter and comparing the first overflow signal of the first counter with the second overflow signal of the second counter after the biasing.

In block 610, the frequency band of operation may be determined based on the interpolated location of the reference frequency. In some embodiments, the intermediate frequency band of operation may be determined to be the frequency band of operation.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 600 may further include detecting when a voltage at an input of the voltage controlled oscillator is outside a predetermined range. In these and other embodiments, the frequency band of operation may be selected when the voltage is outside the predetermined range.

The method 600 may further include placing a predetermined voltage at an input of the voltage controlled oscillator while the frequency band of operation is selected. Alternately or additionally, the method 600 may include placing a first voltage that approximates the predetermined voltage at a node selectably coupled to the input of the voltage controlled oscillator while the node is disconnected from the input of the voltage controlled oscillator. In some embodiments, the node may be disconnected from the input of the voltage controlled oscillator while the frequency band of operation is being selected.

The method 600 may further include electrically disconnecting an input of the voltage controlled oscillator from a phase frequency detector while the frequency band of operation is being selected.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A method of tuning a frequency synthesizer circuit, the method comprising:
   receiving a reference signal at a reference frequency; and
   selecting a frequency band of operation, which contains a range of frequencies including the reference frequency, for a voltage controlled oscillator, the frequency band of operation selected from a plurality of discrete frequency bands, the selecting comprising:
      performing a bi-section selection method to select an intermediate frequency band, including comparing the reference signal and an output signal generated by the voltage controlled oscillator;
      interpolating a location of the reference frequency with respect to the intermediate frequency band and a first frequency band adjacent to the intermediate frequency band; and
      determining the frequency band of operation based on the interpolated location of the reference frequency.

2. The method of claim 1, wherein the intermediate frequency band is determined to be the frequency band of operation.

3. The method of claim 1, wherein comparing the reference signal and the output signal includes comparing a first overflow signal of a first counter configured to count edges of the reference signal with a second overflow signal of a second counter configured to count edges of the output signal.

4. The method of claim 3, wherein the interpolating the location of the reference frequency comprises:
   biasing either the first counter or the second counter; and
   comparing the first overflow signal of the first counter with the second overflow signal of the second counter after the biasing.

5. The method of claim 1, further comprising detecting when a voltage at an input of the voltage controlled oscillator is outside a predetermined range, wherein the frequency band of operation is selected when the voltage is outside the predetermined range.

6. The method of claim 1, further comprising placing a predetermined voltage at an input of the voltage controlled oscillator while the frequency band of operation is selected.

7. The method of claim 6, further comprising placing a first voltage that approximates the predetermined voltage at a node selectably coupled to the input of the voltage controlled oscillator while the node is disconnected from the input of the voltage controlled oscillator, the node being disconnected from the input of the voltage controlled oscillator while the frequency band of operation is selected.

8. The method of claim 1, further comprising electrically disconnecting an input of the voltage controlled oscillator from a phase frequency detector while the frequency band of operation is selected.

9. A frequency synthesizer circuit comprising:
a phase determinator configured to output a phase difference signal based on a phase difference between an output signal and a reference signal at a reference frequency;
a voltage controlled oscillator including a plurality of discrete frequency bands, the voltage controlled oscillator configured to generate the output signal based on the phase difference signal and a frequency band signal that indicates one of the discrete frequency bands; and
a control unit configured to select a frequency band signal to provide to the voltage controlled oscillator by executing operations including:
performing a bi-section selection method to select an intermediate frequency band including comparing the reference signal and the output signal, and
interpolating a location of the reference frequency of the reference signal with respect to the intermediate frequency band and a first frequency band adjacent to the intermediate frequency band.

10. The frequency synthesizer circuit of claim 9, wherein the control unit includes first and second counters, the control unit configured to compare the reference signal and the output signal by comparing a first overflow signal of the first counter, which is configured to count edges of the reference signal, with a second overflow signal of the second counter, which is configured to count edges of the output signal.

11. The frequency synthesizer circuit of claim 10, wherein the control unit is configured to interpolate the location of the reference frequency by performing operations including:
biasing either the first counter or the second counter; and
comparing the first overflow signal of the first counter with the second overflow signal of the second counter after the biasing.

12. The frequency synthesizer circuit of claim 9, further comprising a signal level detector configured to detect when the phase difference signal is outside a predetermined range, the control unit configured to select the frequency band signal based on the phase difference signal being outside the predetermined range.

13. The frequency synthesizer circuit of claim 9, further comprising a disconnect unit configured to place a predetermined voltage at an input of the voltage controlled oscillator while the control unit selects the frequency band signal.

14. The frequency synthesizer circuit of claim 13, wherein the disconnect unit is further configured to place a first voltage that approximates the predetermined voltage at a node selectably coupled to the input of the voltage controlled oscillator while the node is disconnected from the input of the voltage controlled oscillator, the node being disconnected from the input of the voltage controlled oscillator while the control unit selects the frequency band signal.

15. The frequency synthesizer circuit of claim 13, wherein the disconnect unit is further configured to disconnect the input of the voltage controlled oscillator from an output of the phase determinator while the control unit selects the frequency band signal.

* * * * *